United States Patent [19]

Nishiguchi

[11] Patent Number: 5,188,984
[45] Date of Patent: Feb. 23, 1993

[54] SEMICONDUCTOR DEVICE AND PRODUCTION METHOD THEREOF

[75] Inventor: Masanori Nishiguchi, Yokohama, Japan

[73] Assignee: Sumitomo Electric Industries, Ltd., Osaka, Japan

[21] Appl. No.: 649,183

[22] Filed: Feb. 4, 1991

Related U.S. Application Data

[60] Continuation of Ser. No. 430,925, Nov. 2, 1989, abandoned, which is a continuation of Ser. No. 256,455, Oct. 12, 1988, abandoned, which is a division of Ser. No. 184,006, Apr. 20, 1988, abandoned.

[30] Foreign Application Priority Data

Apr. 21, 1987 [JP] Japan .................. 62-98014

[51] Int. Cl.⁵ ............ H01L 21/00; H01L 21/02; H01L 21/60; H01L 21/88
[52] U.S. Cl. .................. 437/211; 437/209; 437/214; 257/777
[58] Field of Search ............ 437/209, 211, 214; 29/829, 837, 842, 844; 357/74

[56] References Cited

U.S. PATENT DOCUMENTS

| | | | |
|---|---|---|---|
| 3,739,463 | 6/1973 | Aird et al. | 437/209 |
| 3,942,245 | 3/1976 | Jackson et al. | 437/211 |
| 3,964,157 | 6/1976 | Kuhn et al. | 437/209 |
| 4,033,027 | 7/1977 | Fair et al. | 437/209 |
| 4,035,607 | 7/1977 | Wu | 437/250 |
| 4,059,467 | 11/1977 | Mancke et al. | 437/250 |
| 4,407,058 | 10/1983 | Fatula, Jr. et al. | 437/209 |
| 4,453,305 | 6/1984 | Janes et al. | 437/225 |
| 4,466,181 | 8/1984 | Takishima | 437/209 |
| 4,483,067 | 11/1984 | Parmentier | 437/209 |
| 4,566,935 | 1/1986 | Hornbeck | 437/228 |
| 4,633,573 | 1/1987 | Scherer | 437/209 |
| 4,758,528 | 7/1988 | Goth et al. | 437/15 |

FOREIGN PATENT DOCUMENTS

| | | |
|---|---|---|
| 0010677 | 1/1977 | Japan . |
| 0074149 | 6/1980 | Japan ........... 437/211 |
| 0121662 | 9/1980 | Japan ........... 437/211 |
| 0143556 | 8/1983 | Japan . |
| 0193051 | 11/1984 | Japan ........... 437/211 |

OTHER PUBLICATIONS

Johnson, R., Silicon Hybrid Wafer-Scale Package Technology, IEEE Journ. of Solid-State Circuits, vol. SC-21, No. 5, Oct. 1986, pp. 845-851.
Csepregi, L., Micromechanics: A Silicon Microfabrication Technology, Microelectronics Engineering 3 (1985), pp. 221-234, North-Holland.

*Primary Examiner*—Brian E. Hearn
*Assistant Examiner*—B. Everhart
*Attorney, Agent, or Firm*—Cushman, Darby & Cushman

[57] ABSTRACT

A semiconductor device is produced through processes that; ionized material is poured into a predetermined depth of a silicon substrate so as to be made into etching stopper layer, a predetermined area of the silicon substrate is etched up to the depth of the etching stopper layer so as to form a concave portion, a compound semiconductor chip is accommodated in the concave portion, insulating film is formed covering a space between the surrounding wall of the concave portion and the side wall of the compound semiconductor chip so as to be patterned, and that a second thin film circuit is so formed on the patterned insulating film as to connect between the electrodes on the compound semiconductor chip and a first thin film circuit which is previously formed on the surface of the silicon substrate.

4 Claims, 2 Drawing Sheets

SEMICONDUCTOR DEVICE AND PRODUCTION METHOD THEREOF

This is a continuation of application Ser. No. 07/430,925, filed on Nov. 2, 1989, which was abandoned, which is a continuation of application Ser. No. 07/256,455, filed on Oct. 12, 1988, now abandoned, which is a division of application Ser. No. 07/184,006, filed on Apr. 20, 1988, now abandoned.

BACKGROUND OF THE INVENTION

1. Field of the Invention

The present invention relates to a semiconductor device in which a high speed and high integrated compound semiconductor element such as gallium arsenide is used, particularly relates to a semiconductor device which is used in a high speed signal processing, and also relates to a method for producing such a semiconductor device.

2. Description of the Prior Art

In many cases, there has been used a gallium arsenide semiconductor device for performing a high speed signal processing in a high frequency band, particularly in a GHz band and higher frequency band.

FIG. 1 shows an example of a conventional packaging type of a semiconductor device in which gallium arsenide is used as a semiconductor element.

FIG. 1(a) is a sectional view showing an example of a constitution of a conventional gallium arsenide semiconductor device. As shown in FIG. 1(a), there is disposed a semiconductor chip 3 made of gallium arsenide in a concave portion 2 provided in the central portion of a base 1 made of ceramics such as alumina, and electrodes (not shown) of the gallium arsenide chip 3 are connected to terminals of a thick film printed circuit 4 formed on the peripheral portion of the concave portion 2 on the base 1 through bonding wires 5 made of such as aurum material.

However, the surface of the ceramic base 1 is so uneven that it is difficult to form a circuit with high precision thereon. Therefore, the minimum width of a thick film printed circuit 4 is approximately 100 $\mu$m, resulting in that it is impossible to package a circuit with high density. Particularly, since it is difficult to form a ground circuit for isolation, impedance conformity cannot be performed, so that the degree of freedom of the connecting circuit pattern is small.

FIG. 1(b) is a sectional view showing another example of packaging type of a conventional semiconductor device. As shown in FIG. 1(b), there is formed a thin film circuit 12 on the flat upper surface of a ceramic base 11, and the thin film circuit 12 is connected through wires 14 to a gallium arsenide semiconductor chip 13 which is disposed to be die-bonded in the central portion of the base 11. Even in this case, however, since the base 11 is made of ceramics, the minimum width of the thin film circuit 12 may be made only approximately 10 $\mu$m so that an integral multi-pack film circuit can not be formed, resulting in that the conventional semiconductor device is not suitable to a package with high density.

FIG. 1(c) is a sectional view showing still more another example of a packaging type of a conventional semiconductor device. As shown in FIG. 1(c), in this case, there is disposed and die-bonded a gallium arsenide chip 23 in the central portion of the upper surface of a silicon substrate 21 having a thin film circuit layer 22 formed on the surface of the silicon substrate 21. The thin film circuit layer 22 is connected to the gallium arsenide chip 23 through wires 24. In this case, since the flatness of the surface of the silicon substrate 21 is remarkably improved because of adopting a silicon substrate, the minimum width of the thin film circuit layer may be made approximately 3 $\mu$m.

However, in any case mentioned above, since wires are used for connecting between the gallium arsenide chip and the thin film circuit, there is a limitation thereby so that the sufficient high density of the thin film circuit has not yet accomplished. Moreover, since the wiring device has a circuit capacity, there often occurs a time lag, so that the conventional semiconductor devices as mentioned above are not suitable to high speed operation.

SUMMARY OF THE INVENTION

An object of the present invention is to provide a semiconductor device and the production method thereof, wherein the semiconductor device has a sufficiently high density of thin film circuit and has good characteristics of high speed operation.

The semiconductor device according to the present invention comprises; a compound semiconductor chip which is disposed in a concave portion, a silicon substrate having a first connecting circuit pattern formed on the surface of the silicon substrate and the concave defined on the substrate, said concave being surrounded by surrounding walls, flattening means for covering over a space between the compound semiconductor chip and the surrounding walls to provide a flat surface, and a second connecting circuit pattern formed on the flat surface for connecting between electrodes on the compound semiconductor chip and the first connecting circuit pattern on the silicon substrate.

Moreover, the method for producing a semiconductor device comprises the steps of forming a first connecting circuit pattern on a substrate, implanting ion in said substrate in order to form an etching stopper layer in a predetermined depth of said substrate, etching a predetermined area of a silicon substrate up to the etching stopper layer to form a concave portion, accommodating a compound semiconductor chip in the concave portion, forming an insulating film layer for covering the space between the peripheral wall of the concave portion and the side wall of the compound semiconductor chip, and forming a second connecting circuit pattern on the insulating film for connecting between the electrodes on the compound semiconductor chip and said first connecting circuit pattern.

In the semiconductor device according to the present invention as described above, since a precise thin film circuit is formed without using a wire, a circuit with higher density can be formed, and it is possible to decrease a capacitance of the connecting circuit pattern, thereby assuring a high speed operation of the semiconductor device.

Moreover, in the method for producing a semiconductor device according to the present invention, the etching process for forming the concave portion is performed after the etching stopper is formed. In addition, the insulating resin film is formed covering over the space between the surrounding wall of the concave portion of the substrate and the side wall of the compound semiconductor chip, and the thin film connecting circuit pattern is formed on the insulating resin film.

Therefore, the semiconductor device mentioned above can be surely manufactured without bonding wires.

DETAILED DESCRIPTION OF THE PREFERRED EMBODIMENT

One example of a semiconductor device according to the present invention and the production method thereof will be explained with reference to the attached drawings as follows. In the explanation of the drawings, similar numerals are used for the similar parts and the redundant explanations are omitted.

Figure 1A:
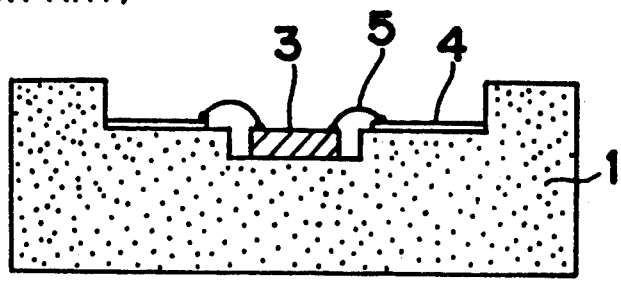
FIGS. 1(a) to 1(c) are sectional views showing components of conventional gallium arsenide semiconductor devices.
Figure 1B:
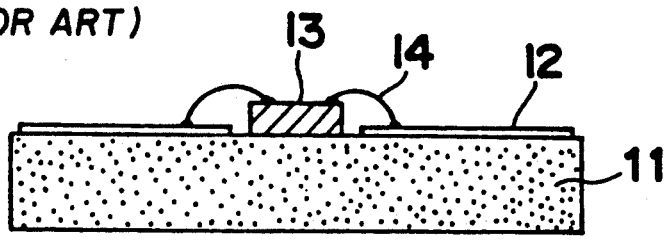
Figure 1C:
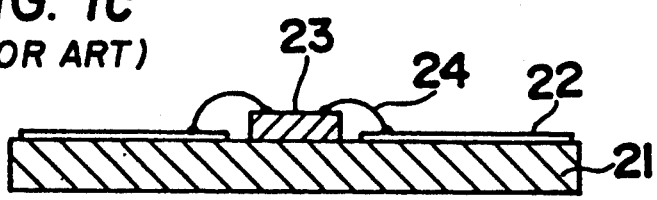
Figure 2A:
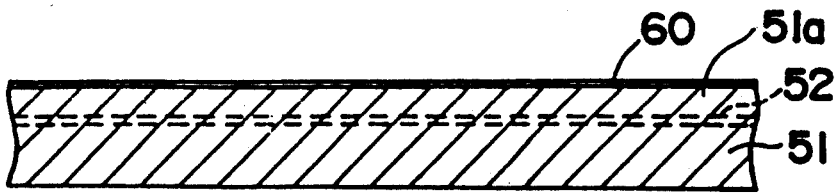
FIGS. 2(a) to 2(e) are process of manufacturing a semiconductor device according to the present invention.
Figure 2B:
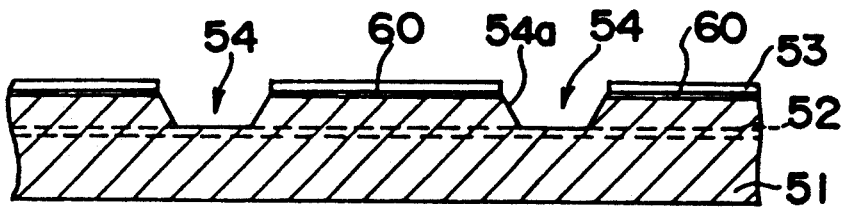
Figure 2C:
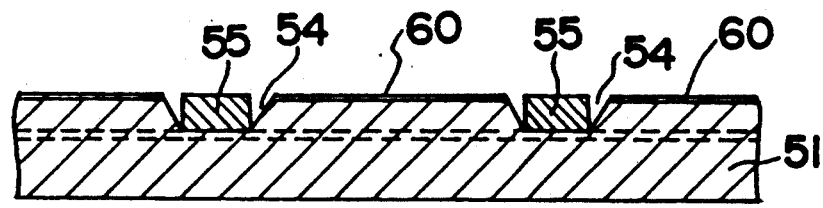
Figure 2D:
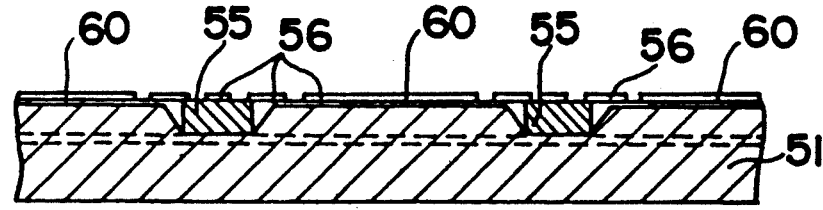
Figure 2E:
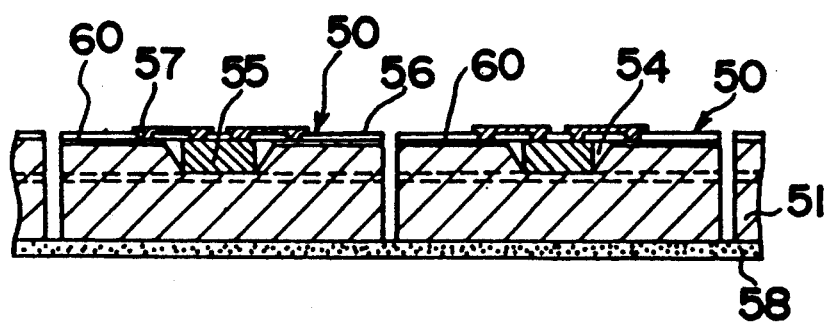

FIG. 2(e) shows a plurality of semiconductor chips 50 after separation process by dicing, wherein a concave portion 54 is formed below the upper surface of a silicon substrate 51 on which a first connecting circuit pattern 60 is already formed and a gallium arsenide chip 55 is buried in the concave portion 54 so that the level of the upper surface of the gallium arsenide chip 55 coincides with the level of the upper surface of the silicon substrate 51. There is formed an insulating resin film 56 on the surface of the gallium arsenide chip 55 and on the surface of the substrate 51, covering over the concave portion 54. Moreover, there is formed a thin film circuit layer 57, i.e., a second connecting circuit pattern made of aluminum for example on the insulating film 56. Thus, the circuit arrangement formed by wires and wire bonding as in the conventional semiconductor device can be eliminated.

Accordingly, bonding pads for wire bonding are unnecessary so that the space for the pads can be omitted, whereby more thin film circuits can be formed in the space corresponding to the space of the pads so that a high density circuit can be provided. Moreover, the lowering of the high frequency characteristic due to the capacity of the wire and the inductance can be prevented.

Next, the process of producing the semiconductor device as mentioned above will be explained.

First, there is prepared a silicon substrate 51, on the crystal orientation (100) surface on which a first connecting circuit pattern 60 is already formed in a predetermined pattern. In the area of a predetermined depth of the silicon substrate 51, there is formed an etching stopper layer 52 by previously implanting ionized boron material in the substrate 51 so as to provide a high dosing density of $7 \times 10^{19}/cm^3$ as shown in FIG. 2(a). A layer 51a above the etching stopper layer 52 may be formed by an epitaxial growth of silicon single crystal after the ionized boron is implanted in the substrate 51. The etching stopper layer 52 may be formed by way of deposit and diffusion method. Next, a mask 53 made of such as silicon dioxide ($SiO_2$) or silicon nitride ($SiN$) is formed on the surface of the silicon substrate 51 by patterning and the mask 53 is processed by anisotropic etching with etchant of mixed liquid of ethylenediamine, pyrocatechol and water. Upon processing as mentioned above, there are formed concave portions 54 each having a side wall 54a of the crystal orientation (111) inclined at an angle of 54.7° to the horizontal surface as shown in FIG. 2(b). The depth of the concave portion 54 is approximately 200 μm. The depth of the concave may be controlled by controlling the etching time.

Next, as shown in FIG. 2(c), the mask 53 is removed and a gallium arsenide chip 55 of approximately 180 μm thick having an integrated circuit pattern (not shown) is disposed in the concave portion 54 so as to provide a die-bonding of approximately 20 μm thick with eutectic crystal alloy of aurum and tin for example. Upon processing as mentioned above, the thickness of the gallium arsenide chip 55 and the die-bonding is equal to the depth of the concave portion 54, therefore, the level of the surface of the gallium arsenide chip 55 coincides with the level of the surface of the silicon substrate 51.

Subsequently, as shown in FIG. 2(d), an insulating film 56 made of such as polyimide is coated on the whole surface of the substrate 51 and the surface of the electrodes of the chips 55 then the coated insulating film 56 is patterned so that the electrodes on the gallium arsenide chips 55 and the circuit on the surface of the substrate 51 are exposed. In the case of the present embodiment, though the spaces between the surrounding wall 54a of the concave portion 54 and the side wall of the gallium arsenide chip 55 are not usually filled with filler perfectly, since the space are so minute that it is not necessary to fill the spaces perfectly, but the spaces may be also filled perfectly.

Next, there is formed a thin film conducting layer on the whole surface of the insulating film 56 by sputtering aluminum, for example, subsequently the conducting layer is patterned for forming an upper thin film connecting circuit layer 57 for connecting the electrodes on the gallium arsenide chip 55 and the first connecting circuit pattern 60 previously formed on the surface of the substrate 51. The width of the upper thin film connecting circuit pattern 57 is approximately 10 μm, which is wider than that of a usual thin film circuit, and since there does not occur such a deformation such as occurs in a wire arrangement in the conventional semiconductor device, it is possible to make a thin film circuit having a higher circuit pattern density than that of the conventional device.

Finally, in an insulating film (not shown) such as a silicon nitride film or a silicon dioxide film is coated on the whole part of the surface by plasma CVD method or by ECR sputtering method so as to make a protecting film, and the substrate 51 is fixed onto the base (not shown) of the dicing device with adhesive tape 58. Then, the fixed substrate 51 is cut by means of a dicing bleed so that the substrate 51 is divided into a plurality of separated individual chips 50 as shown in FIG. 2(e). The semiconductor chips obtained in this way are die-bonded to the base of a package with eutectic crystal alloy of tin and silver, for example, so as to make a semiconductor package.

It is apparent to those skilled in the art that the present invention is not limited to the above mentioned embodiment and that various modifications may be made.

For example, in the present invention, though the etchant of ethylenediamine group is used for forming the concave portion, etchant of hydrazine group can be also used, and the material of the mask may be changed in accordance with the kind of the etchant.

Moreover, the flattening thin film layer is not limited to polyimide layer and any material having good heat resistance and insulating ability can be used. Also, the material of the circuit layer is not limited to aluminum, and various kinds of conductive material can be used.

Furthermore, the surface of the silicon substrate is not limited to a crystal orientation (100) and when the surface of the silicon substrate is made to be a crystal orientation (110), a hole portion having a side wall vertical to the horizontal surface may be formed by etching process.

As described above in detail, in the semiconductor device according to the present invention, the compound semiconductor chip is disposed in the concave portion formed on the surface of the silicon substrate, and since the compound semiconductor chip is connected to the circuit on the surface of the silicon substrate through the thin film circuit, the time lag of transferring signals due to the circuit capacity which can not be avoided in wire-bonding may be prevented and there is an effect of expanding an area for forming a circuit.

Moreover, in the method for producing a semiconductor device according to the present invention, since the wire-bonding is not required, there is an effect that the process of producing a semiconductor device can be reduced.

What is claimed is:

1. A method for producing a semiconductor device comprising the steps of:

forming a first circuit pattern on a substrate having an etching stopper layer in a predetermined depth of said substrate corresponding to a thickness of a compound semiconductor chip and an adhesive of eutectic crystal alloy, etching a predetermined area of a silicon substrate up to the etching stopper layer by anisotropy etching to form a concave portion substantially aligning said first circuit pattern and said corresponding compound semiconductor chip, said concave portion having a side wall inclination substantially greater than a side wall inclination of said corresponding compound semiconductor ship in order to facilitate insertion of said compound semiconductor chip into said concave portion, bonding said compound semiconductor chip directly onto a bottom of said substrate in the concave portion with said adhesive of eutectic crystal alloy, said compound semiconductor chip being substantially aligned with said first circuit pattern, forming a flat insulating film layer surface for covering an electrode of the compound semiconductor chip and a space between a peripheral wall of the concave portion and a side wall of the compound semiconductor chip, patterning the flat insulative film layer surface to expose the electrode of the compound semiconductor chip, and forming a second connecting circuit pattern on the insulating film layer surface for connecting between the exposed electrode on the compound semiconductor chip and said first connecting circuit pattern to form a high-density thin-film circuit.

2. The method according to claim 1, wherein the insulating film is made of polyimide.

3. The method according to claim 1, wherein the etching process for forming the concave portion is performed by using etchant of ethylenediamine group.

4. The method according to claim 1, wherein said second connecting circuit pattern has a width of approximately 10 $\mu m$.